United States Patent [19]

Park

[11] Patent Number: 5,315,204
[45] Date of Patent: May 24, 1994

[54] PIEZOELECTRIC SNAP ACTION SWITCH

[75] Inventor: Kyung T. Park, Berwyn, Pa.

[73] Assignee: The Whitaker Corporation, Wilmington, Del.

[21] Appl. No.: 509,483

[22] Filed: Apr. 16, 1990

[51] Int. Cl.⁵ .................... H01H 13/26; H01L 41/113
[52] U.S. Cl. ..................................... 310/339; 200/181
[58] Field of Search ............... 310/339, 338; 200/181; 341/34

[56]  References Cited

U.S. PATENT DOCUMENTS

| | | | |
|---|---|---|---|
| 2,714,642 | 8/1955 | Kinsley | 310/332 |
| 3,935,485 | 1/1976 | Yoshida et al. | 310/8.5 |
| 3,940,637 | 2/1976 | Ohigashi et al. | 310/339 |
| 3,976,899 | 8/1976 | Fanshawe | 310/8.3 |
| 4,093,883 | 6/1978 | Yamamoto | 310/317 |
| 4,137,475 | 1/1979 | Yoshida et al. | 310/323 |
| 4,158,117 | 6/1979 | Quilliam et al. | 200/181 |
| 4,328,441 | 5/1982 | Kroeger, Jr. et al. | 310/319 |
| 4,383,195 | 5/1983 | Kolm et al. | 310/330 |
| 4,904,894 | 2/1990 | Henry et al. | 310/328 |
| 5,216,316 | 6/1993 | Ipcinski | 310/338 |

OTHER PUBLICATIONS

*Piezoelectric Plastics Promise New Sensors:* Machine Design Oct. 23, 1986, pp. 105-110.

*Primary Examiner*—Thomas M. Dougherty
*Attorney, Agent, or Firm*—William B. Noll

[57] ABSTRACT

A piezoelectric snap action switch for connecting at least two conductive elements via first and second upwardly convex snap action plates disposed in an overlapping manner with respect to each other and respectively connected to the respective conductors. A piezoelectric polymer film with electrodes on respective surfaces thereof is disposed between the snap action plates so that upon depression of the snap action plates the piezoelectric polymer film is caused to extend or contract along a surface thereof so as to conduct an electrical signal between the electrodes on its respective surfaces. The electrical signal is then conducted between the conductors via the electrodes by electrically coupling the electrodes to the snap action plates. The resulting structure is quite rigid so that the switch is virtually insensitive to vibration, and because of the plural snap action plates, metal lead attachment is greatly facilitated.

18 Claims, 9 Drawing Sheets

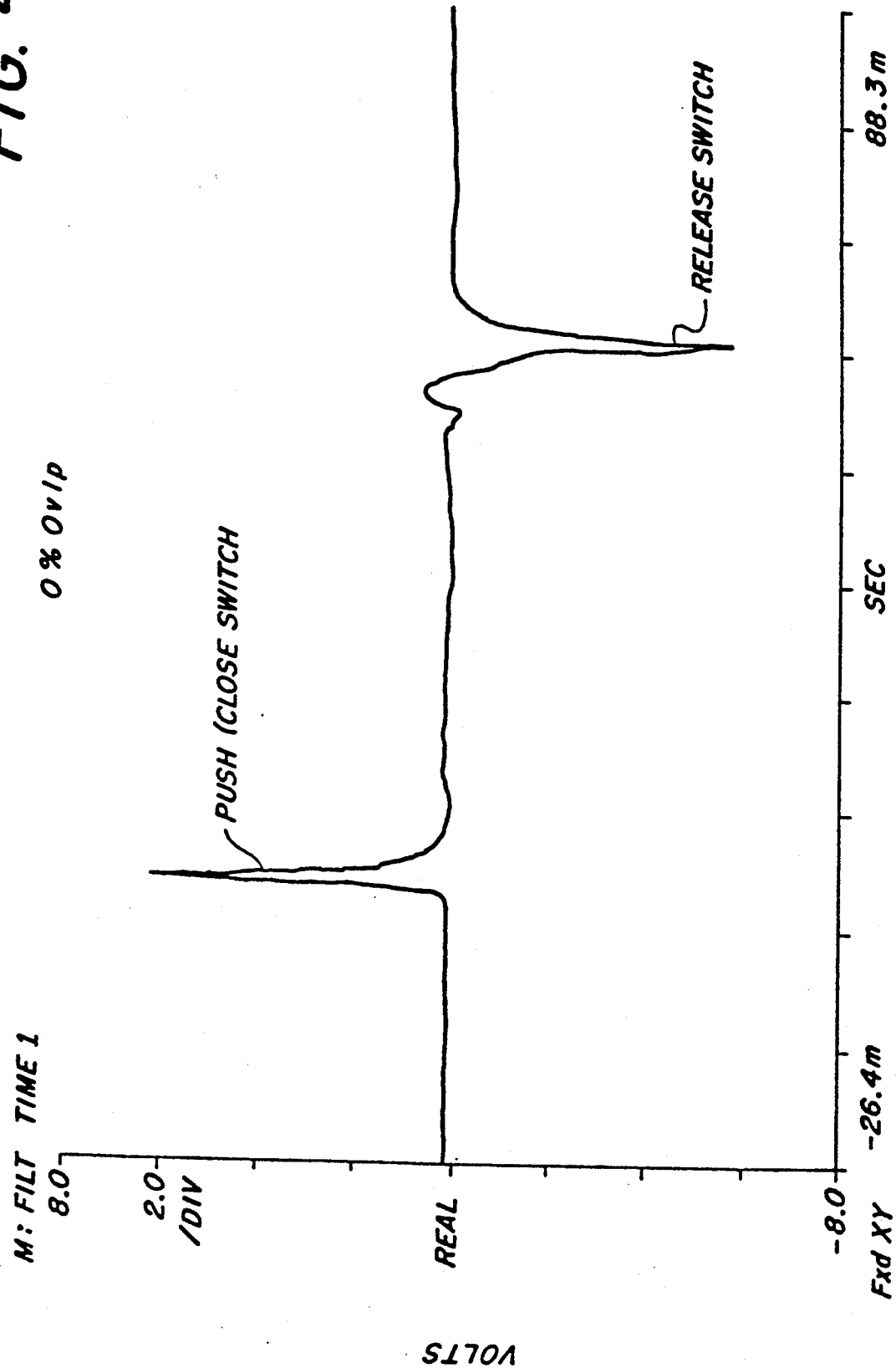

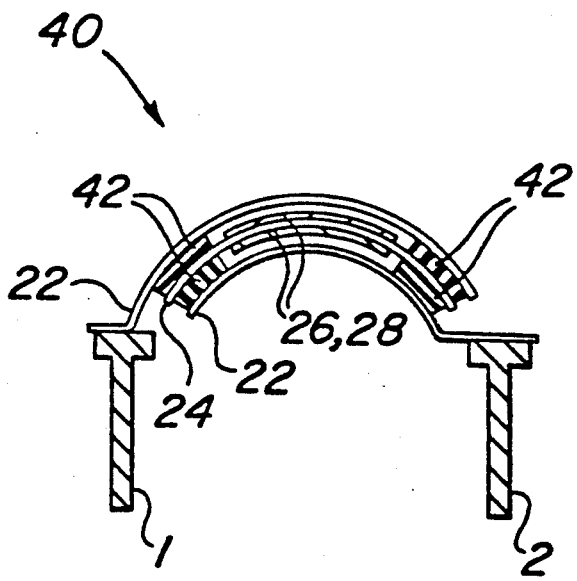
FIG. 9
FIG. 10a
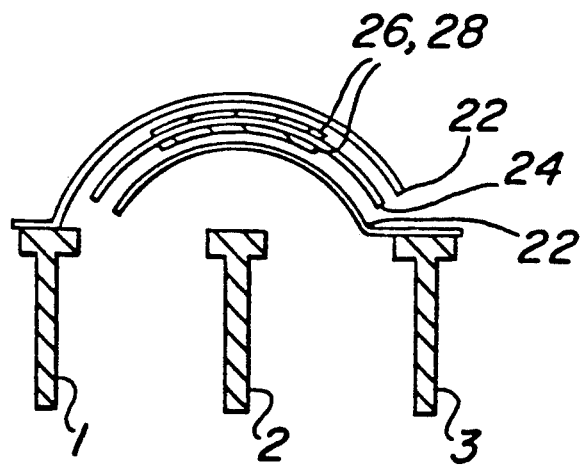
FIG. 10b
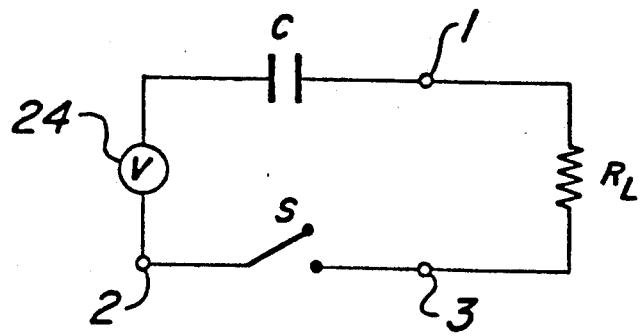

FIG. 15a
FIG. 15b
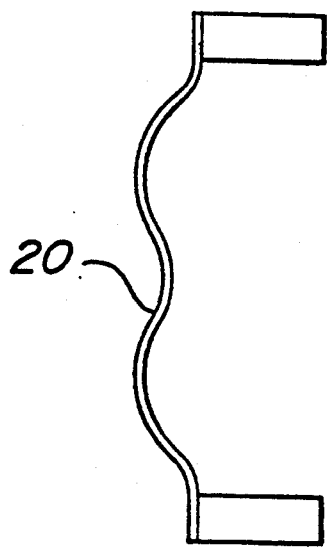
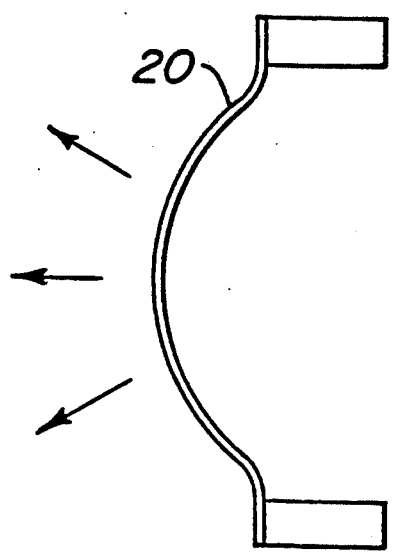
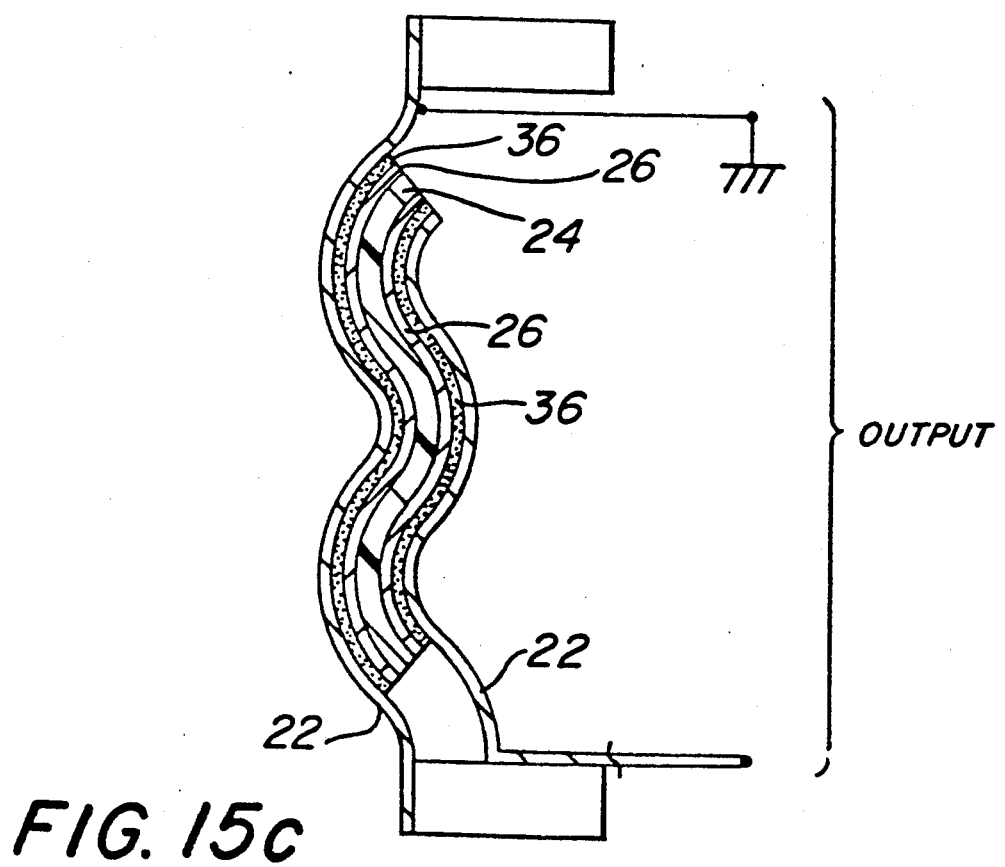
FIG. 15c

PIEZOELECTRIC SNAP ACTION SWITCH

BACKGROUND OF THE INVENTION

1. Field of the Invention

The present invention relates generally to a piezoelectric film switch, and more particularly, to a non-contact piezoelectric snap action switch for use in a keyboard, keypad and the like.

2. Description of the Prior Art

Snap action switches are generally well-known. A conventional snap action switch conducts upon mechanical contact between a metal snap action plate (or snap disc) 10 and metal pins (or conductors on a printed circuit board) 12 as shown in FIG. 1. In such a snap action switch, switch closure is recognized by detecting an electrical short between pin (1) or pin (2) and pin (3). Contact occurs when a sufficient force F is applied to the push-button 14 to cause the metal snap action plate 10 to invert within housing 16 so as to contact pin (3). Pins (1)-(3) are usually connected to other circuitry so that a signal indicative of switch closure can be passed along for further processing.

However, the circuit of FIG. 1 has several disadvantages. Namely, mechanical contact between the metal snap action plate 10 and the pin 3 is unreliable because of the collection of moisture and dirt between the contact points. In addition, further processing circuitry is often required to correct for the effects of "contact bounce". To avoid such problems with mechanical snap action switches, non-contact switches have been proposed.

As described by Ben H. Carlisle in "Piezoelectric Plastics Promise New Sensors", Machine Design (Oct. 23, 1986), pp. 105-110, piezoelectric films have been found to be particularly suited for use in non-contact switches. Piezoelectric film is a flexible, lightweight, tough plastic film which is typically formed of a polarized homopolymer of vinylidene fluoride (e.g., polyvinylidene fluoride or "PVDF"). Piezoelectric film is adaptable to diverse applications because of its piezoelectric nature, whereby a voltage is produced upon mechanical deformation of the piezoelectric element. KYNAR® piezoelectric film, available from ATOCHEM North America, Inc. (ATOCHEM), is one example of a suitable piezoelectric film.

It is well-known that when a working voltage is applied to the electrodes of a piezoelectric film it will elongate or contract, depending on the polarity of the applied voltage. If the piezoelectric film is exposed to an alternating voltage, it will elongate and contract as the polarity changes. Moreover, it is also well-known that when a external force is applied to the film (e.g., compressive or tensile strain) the film develops a proportionate open circuit voltage. Exposure to a reciprocating force results in a corresponding alternating electrical voltage signal across the piezoelectric film.

For most applications, a piezoelectric film switch can be made by laminating a piezoelectric film to one surface of a thin, flat spring. When a stress is applied to the film, such as by deflecting the spring, a voltage pulse is provided. A "snap action" piezoelectric switch of this type is described by Fanshawe in U.S. Pat. No. 3,976,899, for example. In such a switch, the amplitude of the voltage pulse of the piezoelectric film switch is directly proportional to the magnitude of the applied stress, and hence to the resulting strain. Also, since the applied stress acts upon the film's cross-section, deforming the film by stretching its length will maximize the stress and, therefore the resulting output voltage. These characteristics of the piezoelectric switch render it quite practical for use as a switching element in a keyboard, keypad and the like. Further examples of switches including piezoelectric films are described in U.S. Pat. No. 4,158,117 to Quilliam et al; U.S. Pat. No. 4,328,441 to Kroeger, Jr., et al: U.S. Pat. No. 3,935,485 to Yoshida et al and U.S. Pat. No. 4,137,471 to Yoshida et al. See also copending U.S. patent application Ser. No. 07/429,381, entitled "Dual Direction Switch."

Piezoelectric film switches have distinct advantages over conventional mechanical switches in that they are not susceptible to malfunction by contaminants such as dirt, moisture and abrasive dust. Also, since a piezoelectric film switch operates essentially by developing a charge within the film and transferring that charge to the film's outer electrodes, no mechanical closure or opening is required to make or break an electrical contact. Moreover, unlike membrane keyboards which radiate high frequencies during an electronic scan, piezoelectric film switches operate at low current and generate minimal RF levels. Piezoelectric film switches also do not experience "contact bounce" and therefore greatly simplify circuit design.

Additional information relating to the structure, properties, applications and fabrication of piezoelectric film switches, as well as piezoelectric films in general, can be found in the KYNAR® Piezo Film Technical Manual (1987), which is available from ATOCHEM. That manual is incorporated herein by reference.

Previous attempts also have been made to incorporate the above-mentioned benefits of a piezoelectric film switch into a snap action type switch. For example, in U.S. Pat. No. 4,383,195, Kolm et al disclose a piezoelectric snap actuator including a piezoelectric element and a snap action device for exerting a force in opposition to the piezoelectric element. The snap action device has a predetermined reaction force that must be overcome by the applied force of the piezoelectric element to cause the snap action. For this purpose, an electric field is applied to the piezoelectric element to enable it to generate an opposing force in excess of the reaction force of the snap action device and to store energy in the snap action device necessary to enable occurrence of the snap action.

However, the device of Kolm et al is ineffective for converting a mechanical action into an input signal because it instead converts an electrical signal into a mechanical action. In other words, the snap action switch of Kolm et al operates by applying voltage pulses to the piezoelectric element until the snap action device changes state. On the other hand, when a snap action switch is used as an input device, a mechanical force is applied to the snap action device until the piezoelectric element generates a signal indicating that the snap action device has been depressed by a user. The present invention is of the latter type.

A piezoelectric switch of the latter type has been disclosed by Ohigashi et al in U.S. Pat. No. 3,940,637. Ohigashi et al describe a switch containing a convex elastic plate made of a copper-beryllium alloy which is mounted on a substrate containing an aperture. A piezoelectric film having electrodes on both sides thereof is adhered to the convex plate above the aperture so that when a force is applied downwardly on the combination of the convex plate and the piezoelectric film the convex disc flexes to create the snap action. The snap action of the convex plate thereby induces strain in the piezoelectric film to produce an output voltage. The switch may be further simplified by forming the piezoelectric film to have a snap action characteristic so that the piezoelectric film itself forms the key switch.

Switches of the type disclosed by Ohigashi et al are particularly useful as key switches because the switch provides a predetermined output for a predetermined strain velocity by prohibiting an output signal from being generated unless sufficient force is applied to the key switch by an operator's finger. In other words, only when the elastic plate of Ohigashi et al is sufficiently strained by an operator's finger will a pulse signal having a predetermined value and form be generated by the piezoelectric film through its layer electrodes. Also, since the elastic plate exerts a snap action, just after the input force or the enforced strain reaches the predetermined value, the strain increases considerably instantaneously. Then, upon removal of the input force, the elastic plate returns to its original state.

However, the piezoelectric switch disclosed by Ohigashi et al has several problems. Namely, because the piezoelectric film of the switch is directly responsive to an externally applied force, the piezoelectric film may be subject to wear, adversely affecting the switch's durability. In addition, it is difficult to attach external electrical conductors to the switch due to the lack of reliability of connection of metal conductors to the piezoelectric film. Moreover, when a vibrational force is detected by the switch of Ohigashi et al, the piezoelectric film is subjected to stress or strain which may inadvertently cause an output signal to be generated. Such vibration induced signals may cause spurious output signals from the keypad and hence spurious input signals to the responsive circuitry.

As a result of the above-mentioned deficiencies in the prior art, there has been a long-felt need to provide a more rigid piezoelectric snap action switch which is not affected by vibration and which may be readily connected to metallic conductors.

SUMMARY OF THE INVENTION

A non-contact piezoelectric switch according to the invention includes first and second curved snap action plates having a piezoelectric polymer film disposed therebetween so that respective surfaces are disposed between the first and second snap action plates. First and second electrodes are disposed on the respective surfaces of the piezoelectric polymer film so that upon depression of at least one of the snap action plates the piezoelectric polymer film is extended or contracted along the surface thereof so as to conduct an electrical signal between the first and second snap action plates via the first and second electrodes.

In preferred embodiments of the invention, the first and second electrodes on the piezoelectric polymer film are either connected to the first and second snap action plates through conductive adhesive layers or clamped within an assembly so as to be electrically connected to the snap action plates by capacitive coupling.

In one embodiment of the invention, the piezoelectric polymer film is a bimorph which immunizes the switch from surface vibrational noise by common mode rejection (i.e., the respective piezoelectric polymer film layers have sides of like polarity disposed adjacent to each other).

In another embodiment of the invention, surface vibrational noise is prevented by disposing electrical insulating means between the first and second electrodes and the first and second snap action plates so that when the snap action plates are in a non-depressed state electrical conduction cannot occur between the first and second snap action plates.

In yet another embodiment of the invention, three conductors are brought into electrical contact with each other upon depression of the snap action plates. Means are also provided for minimizing the effects of charges built-up in the piezoelectric film when the piezoelectric film is in a non-depressed state.

The piezoelectric snap action switch of the respective embodiments of the invention preferably uses piezoelectric polymer films such as polyvinylidene fluoride (PVDF), copolymers of vinylidene fluoride (VDF) including at least one of trifluoroethlyene, tetrafluoroethylene, hexafluoroethylene and vinylidene chloride, and/or a polymer of at least one of polyvinyl chloride and acrylonitrile.

The present invention facilitates electrical lead attachment to piezoelectric film and immunizes the piezoelectric film from mechanical vibration noise. The resulting device is vibration insensitive and can provide an output signal with a higher signal-to-noise ratio than heretofore possible. Thus, the present invention is more reliable than conventional snap action type switches since a piezoelectric polymer film is used as a pressure sensor and since a more rigid structure is provided which prevents spurious signals caused by vibration and which facilitates the attachment of electrical leads thereto. The switch of the invention is thus durable enough to be used as a pressure limit or a temperature limit switch as well.

BRIEF DESCRIPTION

Exemplary embodiments of the invention will hereinafter be described in more detail with reference to the accompanying drawings in which.

Figure 1:
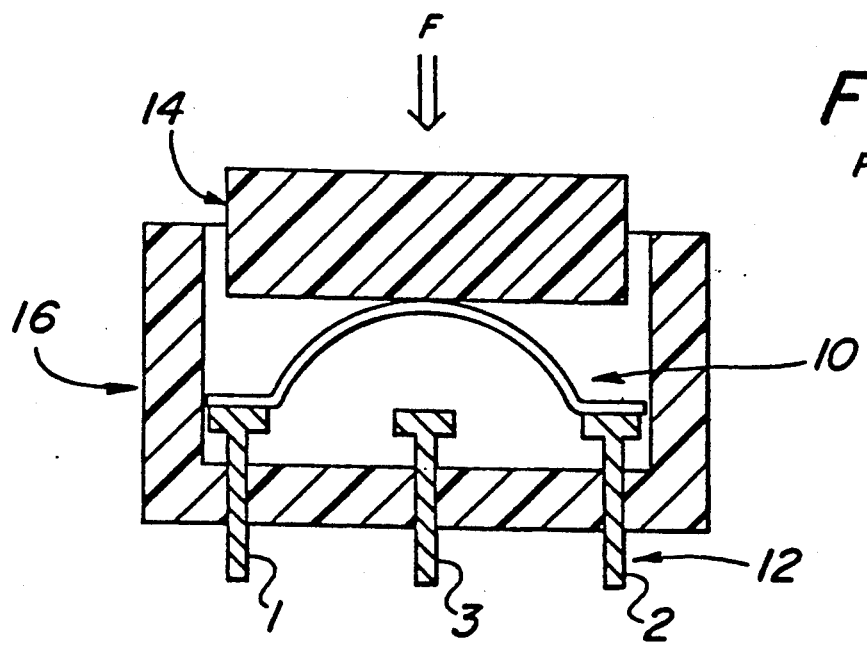
FIG. 1 illustrates a conventional snap action switch which depends on a mechanical contact between a metal snap disc and metal pins for switch closure.
Figure 2A:
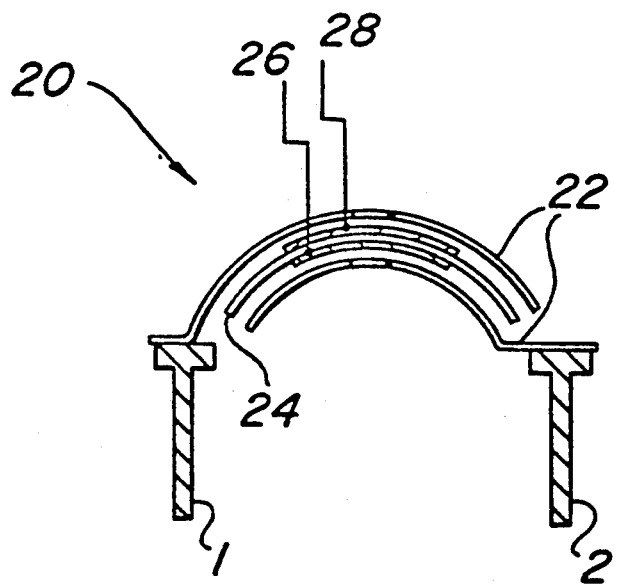
FIG. 2(a) illustrates a piezoelectric snap action switch in accordance with a first embodiment of the invention.
Figure 3A:
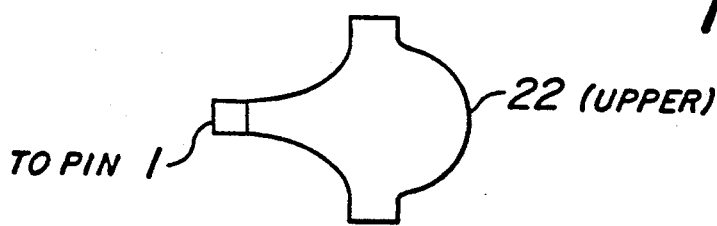
Figure 3B:
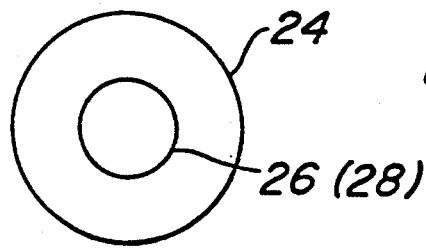
Figure 3C:

FIGS. 3(a)-(c) together illustrate an embodiment of the switch of FIG. 2(a) in which the piezoelectric film and electrodes are disc-shaped.

FIG. 4 graphically illustrates a typical output of the switch of FIG. 2(a).

Figure 5A:
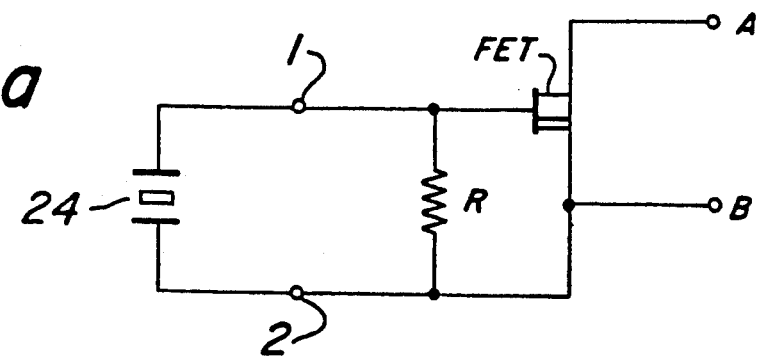

FIG. 5(a) illustrates an embodiment of a circuit for converting the output of the switch of FIG. 2(a) into a digital signal.

Figure 5B:
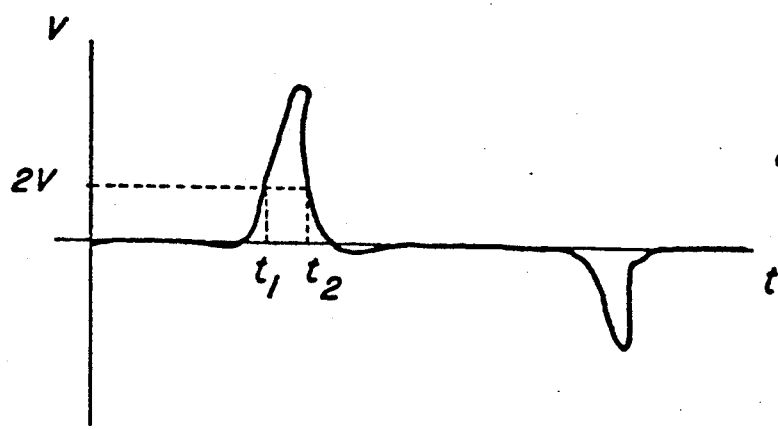

FIG. 5(b) graphically illustrates a typical output of the circuit of FIG. 5(a).

Figure 6:
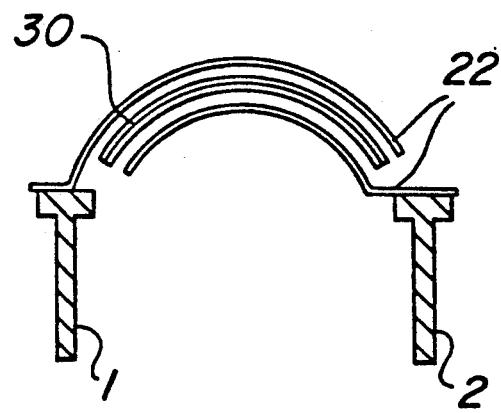

FIG. 6 illustrates an embodiment of a piezoelectric snap action switch in which a bimorph is used as the piezoelectric film for minimizing the vibrational noise.

Figure 7:
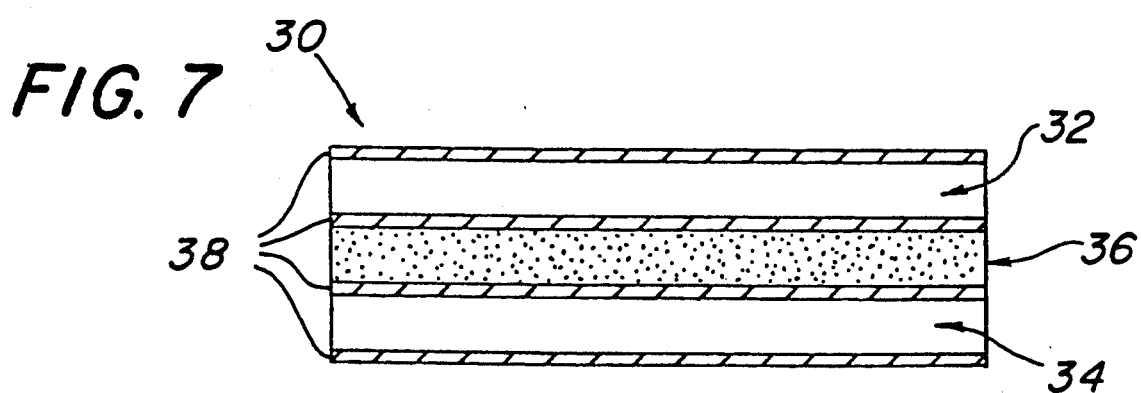

FIG. 7 illustrates a detailed cross-sectional view of the bimorph of FIG. 6.

Figure 8A:
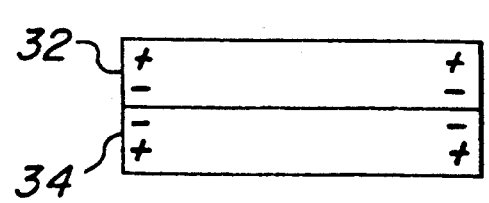
Figure 8B:
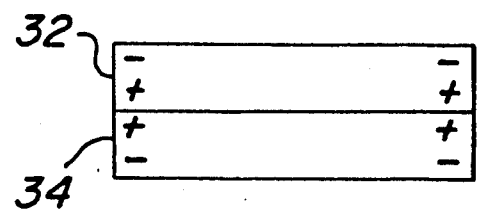

FIGS. 8(a) and 8(b) illustrate possible polarities of the bimorph of FIG. 7.

FIG. 9 illustrates an embodiment of a piezoelectric snap action switch in which a ring-shaped electrical insulator is used between the snap action plates for minimizing vibrational noise.

FIG. 10(a) illustrates an embodiment of a piezoelectric snap action switch having a three pin configuration.

FIG. 10(b) illustrates an equivalent electrical circuit of the embodiment of FIG. 10(a).

Figure 11A:
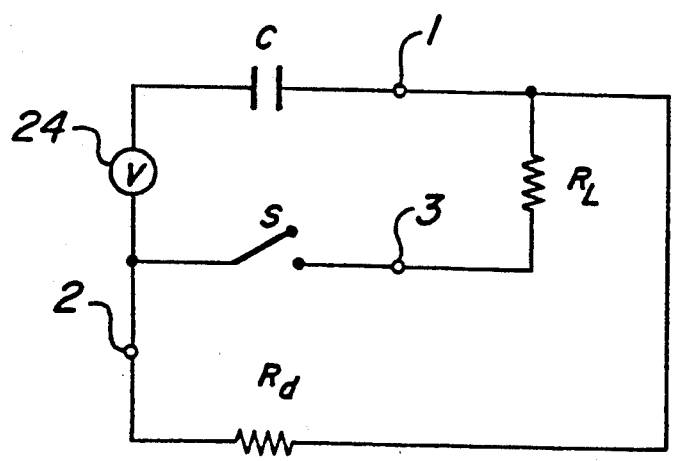
Figure 11B:
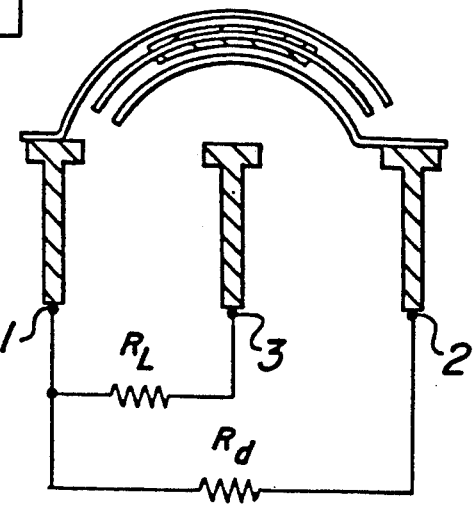

FIGS. 11(a) and 11(b) illustrate an embodiment of a three pin switch in which a resistor is placed between the first and second pins in order to prevent the charges caused by the release of the switch from affecting the output of the switch.

Figure 12A:
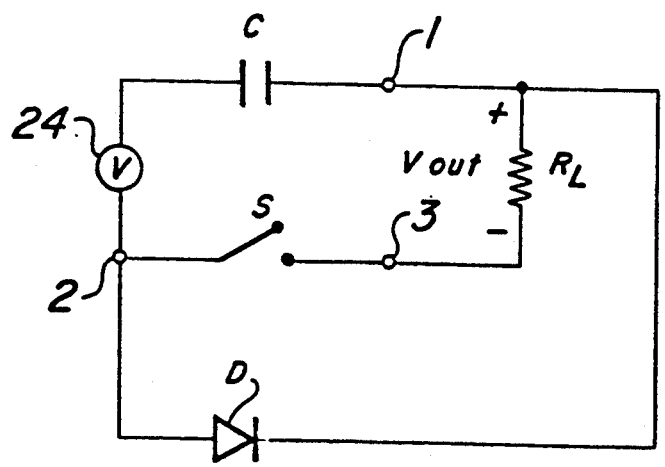
Figure 12B:
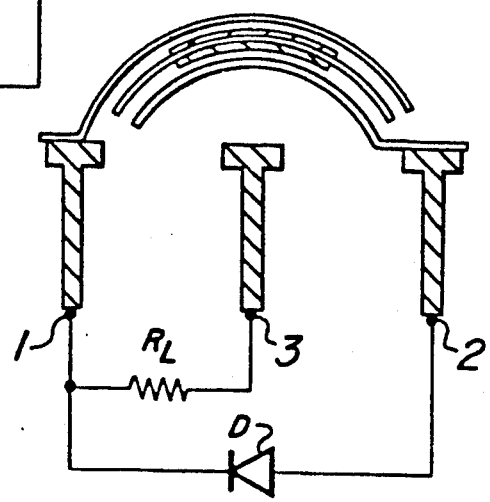

FIGS. 12(a) and 12(b) illustrate an embodiment of a three pin switch in which a diode is placed between the first and second pins in order to prevent the charges caused by the release of the switch from affecting the output of the switch.

Figure 13:
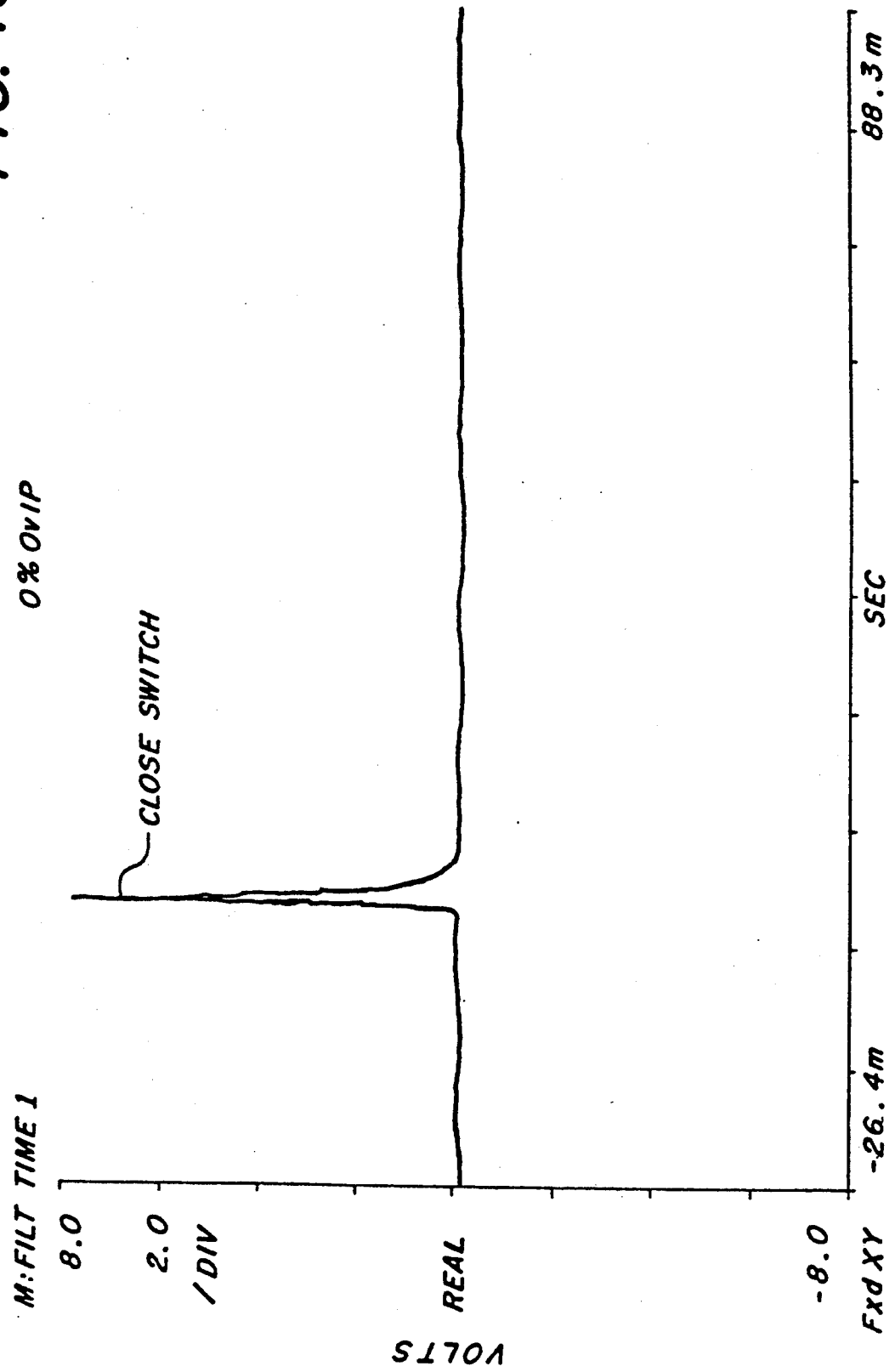

FIG. 13 graphically illustrates a typical output of the switches of FIGS. 11 and 12.

FIGS. 14(a)-(e) together illustrate an embodiment of the invention used as a pressure limit switch.

FIGS. 15(a)-(c) illustrate an embodiment of the invention used as a temperature limit switch.

DETAILED DESCRIPTION OF THE PREFERRED EMBODIMENTS

The invention will now be described with reference to the drawings, wherein like characters designate like or corresponding parts throughout the several views. Although the present invention is described as a switch for a keypad or a keyboard and the like, it should be understood that the description herein is for exemplary purposes only. The invention is not limited to the disclosed exemplary embodiments except as expressly set forth in the appended claims. A first embodiment of the invention now will be described with reference to FIG. 2(a).

The piezoelectric snap action (or snap disc) switch 20 of the invention generally comprises a pair of metallic snap action plates (snap discs) 22 respectively connected to pins 1 and 2. A first metallic snap disc plate 22 has a solid contact to pin 1, while a second metallic snap disc plate 22 has a solid contact to pin 2. As shown, the snap disc plates 22 are disposed with respect to each other such that one snap disc plate overlaps the other in a convex configuration. A piezoelectric polymer film 24 having electrodes 26 and 28 on respective surfaces thereof is disposed between the respective snap disc plates 22. The piezoelectric film 24 and the electrodes 26 and 28 may be adhered to either or both of the metallic snap disc plates 22 using a flexibly conductive or insulating adhesive. When the latter is employed, the electrodes 26 and 28 are capacitively coupled to the snap disc plates 22. Alternatively, the piezoelectric film 24 may be clamped in place within the switch housing so as to be electrically connected to the metallic snap disc plates 22 by contact during depression of the snap disc plates 22. The snap disc assembly 20 also may be clamped in place as part of a keyboard arrangement.

As an alternative embodiment of the present invention, the electrodes 26 and 28 may be eliminated so that the snap disc plates 22 function as the electrodes. In such an embodiment, the piezoelectric polymer film 24 is adhered to the snap disc plates 22 or clamped using any of the aforementioned techniques. However, from a reliability standpoint, it is presently preferred to use the electrodes 26 and 28 in the switch 20.

Figure 2B:
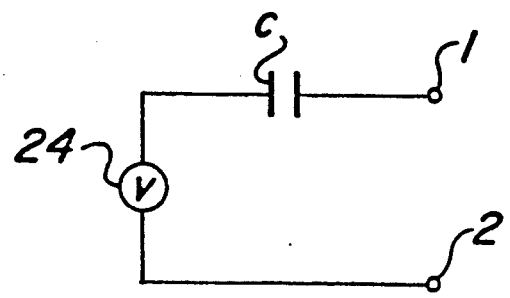
FIG. 2(b) illustrates an equivalent electrical circuit of the embodiment of FIG. 2(a).

The equivalent electrical circuit of the embodiment in FIG. 2(a) is shown in FIG. 2(b). As shown, the piezoelectric film 24 functions when stressed or strained as a voltage source for supplying a voltage across pins 1 and 2. The equivalent circuit also contains a capacitance C which represents the capacitance of the piezoelectric polymer film 24.

FIGS. 3(a)-(c) represent proposed shapes of the piezoelectric film 24 and the electrodes 26 and 28 (FIG. 3(b)), the upper snap disc plate (FIG. 3(a)) and the lower snap disc plate (FIG. 3(c)). As shown, the piezoelectric film 24 and electrodes 26 and 28 may be selected to be substantially disc-shaped so as to cooperate with the convex metallic snap disc plates 22. Preferably, the piezoelectric film 24 fully insulates the electrodes 26 and 28 and the upper and lower metallic snap disc plates 22 from each other when the switch is in a non-depressed state. The pins 1 and 2 are connected to the metallic snap disc plates 22 as shown.

The electrical output through the pins 1 and 2 can be varied by varying the thickness, the types of piezoelectric material used and the electrode pattern of the piezoelectric film 24. A typical output is shown in FIG. 4, whereby a positive voltage pulse is output when the convex snap disc plates 22 are pressed together. As shown, a negative going pulse is also generated when the convex snap disc plates 22 are released during the release of the switch. Circuitry for eliminating this negative-going pulse will be described in further detail below with reference to FIGS. 11-13.

The electrodes 26 and 28 touch the piezoelectric film 24 for electrical contact and may be electrically connected to the metallic snap disc plates 22 through a conductive adhesive layer or through a non-conductive adhesive layer by capacitative coupling. Thus, when the piezoelectric film 24 is stressed or strained, the electrodes 26 and 28 (and hence both metallic snap disc plates 22) receive the voltage potential across the piezoelectric film 24. On the other hand, when the switch 20 is not depressed, the piezoelectric film 24 works as an insulator between the top and bottom metallic snap disc plates 22 due to the absence of stress and strain upon the piezoelectric film 24.

Preferably, the piezoelectric film layer 24 of the present invention comprises any polymeric material that exhibits a piezoelectric effect, such as polyvinylidene fluoride (PVDF); a copolymer of vinylidene fluoride (VDF), such as a copolymer of VDF including at least one of trifluoroethylene (TrFE), tetrafluoroethylene, hexafluoroethylene or vinylidene chloride; a polymer of polyvinyl chloride; or a polymer of acrylonitrile. One suitable polyvinylidene fluoride film is manufactured under the registered trademark KYNAR ® by ATOCHEM, although other polymeric piezoelectric films can be utilized without departure from the true scope of this invention. More detailed information relating to particular piezoelectric film products of this type is found in the "KYNAR ® Piezo Film Product Summary and Price List" (1988), available from ATOCHEM. The other above-mentioned films that can be employed in the practice of this invention are also commercially available.

Metallic electrodes 26 and 28 may be applied to the inner and outer faces of the piezoelectric film 24 using any conventional process for applying the electrodes, but two presently preferred processes are: (1) deposition of thin metal layers by vacuum metallization, or (2) deposition of thicker coatings by spraying o silk-screening with conductive silver ink. By way of example only, the metallic electrodes 26 and 28 may comprise a metal selected from the group consisting of copper, silver, nickel, aluminum, tin, gold and chromium, as well as combinations thereof (e.g., NiAgNi).

The electrodes 26 and 28 may be adhered to the snap disc plates 22 by acrylic, epoxy, urethane and cyano acrylate polymer based adhesives which are all suitable for use as adhesive layers. For example, a very thin, high strength, rigid adhesive layer is obtainable with epoxies such as G. C. Electronics EPOX #347 with Hardener #10-347 or Loctite Corporation's Duro E-POX-E 5 Resin. One suitable urethane-based adhesive is TYCEL®, which is manufactured by Lord Corporation as a general purpose adhesive for bonding piezoelectric film to most surfaces. Ultra-thin bonding layers can also be achieved by applying a resin to one surface, and its hardener to the other. An extremely thin layer of Loctite #495 cyano acrylate is also suitable with silver ink metallization.

FIG. 5(a) shows an embodiment of a circuit for converting the output of the piezoelectric snap action switch 20 into a digital signal. As shown, the voltage across the piezo- electric film 2 is applied to both pins 1 and 2 when a stress or strain is applied to the piezoelectric film 24. A short circuit is thus obtained between pins 1 and 2 and hence between outputs A and B via FET and resistor R during the time interval $t_2 - t_1$ in which the piezoelectric film 24 is conductive. The resulting output signal can be seen in FIG. 5(b), where the output signal is given a pulse value of 2 volts as shown in phantom in the figure.

FIG. 6 shows an embodiment of the invention whereby a bimorph 30 is used as the piezoelectric polymer film 24 in order to immunize the switch from vibration induced noise. Bimorphs are piezoelectric materials having two layers which exhibit an amount of bending adequate to actuate a switch. As is well-known, an applied voltage causes one film to elongate and the other film to contract with a resulting "bender" motion. The two layers include two layers of piezoelectric material 32 and 34 having a conductive layer 38 between and on opposite sides of each of the piezoelectric layers 32 and 34, as shown in FIG. 7.

The piezoelectric layers 32 and 34 of bimorph 30 are connected by an adhesive layer 36 which is either a conductive material or a thin nonconductive material that allows layers 32 and 34 to be capacitively coupled.

Vibrational noise is reduced in the embodiment of FIG. 6 by disposing the piezoelectric film layers 32 and 34 such that sides of like polarity are arranged to face each other as shown in FIGS. 8(a) and 8(b). Due to this arrangement, bimorph 30 cancels out the electrical noise due to mechanical vibration by common mode rejection. In other words, the repellant nature of the piezoelectric layers 32 and 34 minimize vibration noise by common mode rejection, whereby the piezoelectric elements, when not rendered conductive by depression, repel each other. Bimorph switches in other arrangements are generally known, and a general description of the operation of a bimorph switch of the type shown in FIG. 7 can be found in U.S. Pat. No. 4,093,883 to Yamamoto.

Another embodiment of a switch 40 for eliminating the vibrational noise will now be described with respect to FIG. 9. In FIG. 9, a ring-shaped electrical insulator 42 of a suitable insulating material is provided between the disc-shaped piezoelectric film 24 and each of the metallic snap disc plates 22 in order to prevent an output signal in the absence of depression of the switch 40.

In particular, when vibration occurs, the electrical charge (voltage) which is induced on the piezoelectric film 24 as noise will not be conducted to pins 1 and 2 because the electrodes 26 and 28 will not be permitted by ring insulator 42 to touch the metallic snap disc plates 22 in the absence of a sufficient bending force which is applied when the switch is depressed. In other words, only when the metallic snap disc plates 22 are depressed enough to make electrical contact to the piezoelectric film 24 via electrodes 26 and 28 will a signal be conducted between pins 1 and 2.

FIG. 10(a) shows a three pin configuration for vibrational noise elimination in accordance with a further embodiment of the invention, while FIG. 10(b) shows the equivalent electrical circuit.

In the embodiment of FIG. 10(a), when the upper metallic snap disc plate 22 is depressed, the charge generated on the piezoelectric film 24 due to the resulting strain will flow through the electrodes 26 and 28 to pins 1 and 2, respectively. However, if the upper metallic snap disc 22 is sufficiently depressed to force the lower metallic snap disc plate 22 into contact with pin 3, a circuit connected to pin 3 will be appropriately activated in accordance with its connection to a circuit connected to either pin 1 or pin 2. In the equivalent circuit of FIG. 10(b), switch S has been shown to represent this snap action effect, while, as in FIG. 2(b), capacitance C represents the capacitance of the piezoelectric polymer film 24. Resistance $R_L$ represents the circuit connected to pin 3.

The three pin switch of FIG. 10(a) has the advantage that it is vibration insensitive and has a higher output because of a better signal-to-noise ratio when the switch is depressed. This is so because the charge caused by bending of the piezoelectric film 24 will accumulate on the film 24 until it touches pin 3. Then, when the lower metallic snap disc plate 22 touches pin 3 so that a closed loop is formed through the load $R_L$, the electrical charge is dumped out through pin 3 in a short time interval so that a higher output voltage can be obtained. However, when the switch of FIG. 10(a) is released, the charges developed due to the switch release action will be stored in the piezoelectric film 24 and no closed path will exist for the discharge. As a result, when the switch is depressed quickly, the positive charge on the piezoelectric film 24 caused by depression of the switch will be cancelled out by any built-up negative charge on the piezoelectric film 24 caused by the release of the switch, thereby causing the output of the switch to b significantly reduced.

The above-mentioned problem can be overcome by disposing a resistor $R_d$ between the pins 1 and 2 as shown in FIGS. 11(a) and 11(b) or by placing a diode D between pins 1 and 2 as shown in FIGS. 12(a) and 12(b). In the embodiment of FIGS. 12(a) and 12(b), the direction of the diode D depends on the polarity of the piezoelectric film 24, as would be apparent to one of ordinary skill in the art. Resistor $R_d$ and diode D prevent the above-mentioned negative charge from building up on the piezoelectric film 24 so that the negative going pulse caused by the release of the switch is not generated, as shown in FIG. 13.

The piezoelectric snap action switch of the invention thus has the benefits that an additional metallic snap disc plate 22 is placed over the piezoelectric film 24 so that lead attachment to the respective pins is made simpler. This is particularly advantageous for circuit configurations whereby the piezoelectric snap action switch is very small, thereby rendering lead attachment very difficult. Moreover, the invention thereby increases the reliability of the connection to the piezoelectric film 24 since metal to metal contact is used for connection of the leads. Also, the present invention overcomes the problems caused by mechanical vibration since the additional metallic snap disc plate 22 results in a more rigid structure and since novel techniques are utilized for prevention of undesired electrical contact due to mechanical vibration. These and other beneficial features of the invention are believed to result in a more practical piezoelectric switch than heretofore available.

Obviously, many modifications and variations are possible in light of the above teachings. For example, although the switch has been described with respect to conductive pins, it should be understood that the conductive pins may be replaced by the conductive elements of a printed circuit board. Moreover, one skilled in the art would also realize that the switch of the invention may be configured as part of a switching layer of a keyboard or keypad, whereby a plurality of snap action switches are disposed adjacent to one another to form the keyboard or keypad.

Figure 14A:
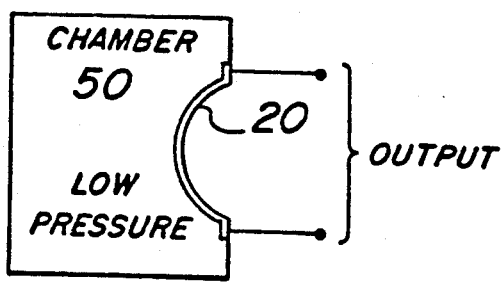
Figure 14B:
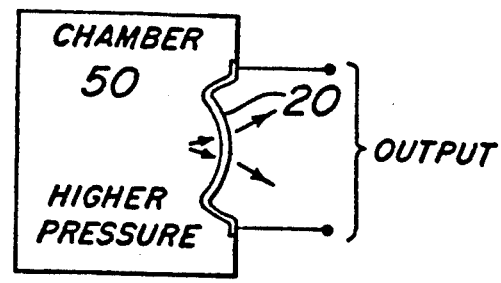
Figure 14C:
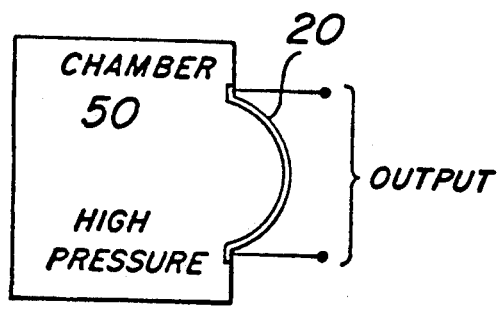
Figure 14D:
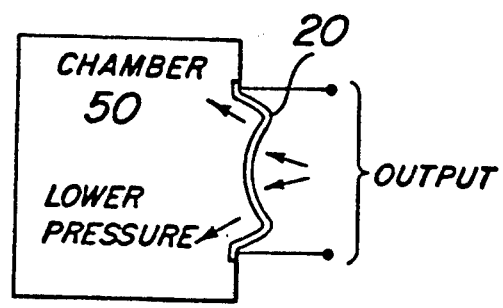

In addition, as shown in FIGS. 14(a)-(e) another possible use of the invention as herein described is as a pressure limit switch. For example, by disposing the snap action switch 20 of the invention across an opening in a chamber 50 as shown in FIG. 14(a), the difference in air or liquid pressure between the inside and outside of the chamber 50 may be monitored. In other words, when the pressure within the chamber 50 exceeds a preset pressure (such as the pressure of the ambient air), the snap action switch 20 will react as shown in FIG. 14(b) and generate an electrical pulse which indicates that the chamber pressure exceeded that of the preset pressure. Similarly, by disposing the snap action switch 20 of the invention across an opening in chamber 50 as shown in FIG. 14(c), an electrical pulse which indicates that the chamber pressure has fallen below the preset pressure will be generated by snap action switch 20 as it reacts as shown in FIG. 14(d). The preset pressure may be determined and adjusted by selecting a proper thickness for the materials and shape of the snap action switch 20 as would be apparent to one skilled in the art.

Figure 14E:
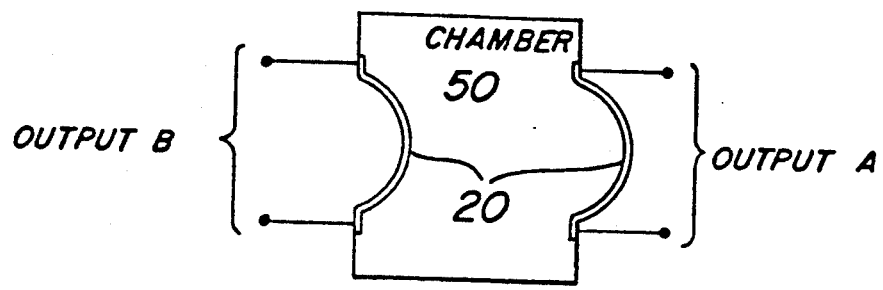

The arrangement shown in FIGS. 14(a)-(d) can also be used to monitor the pressure outside of the chamber by using the chamber pressure as the preset pressure. Moreover, by arranging snap action switches 20 as shown in FIG. 14(e), both high and low pressure limits may be monitored. For example, when the pressure outside the chamber 50 in the arrangement of FIG. 14(e) becomes lower than the pressure in chamber 50, an electrical pulse will be generated at output B, while no output is generated at output A. Similarly, when the pressure outside the chamber 50 becomes higher than the pressure in chamber 50, an electrical pulse will be generated at output A, while no output is generated at output B.

As a further example of a possible use of the invention, the invention may be implemented as a temperature limit switch as shown in FIGS. 15(a)-(c). Namely, by mounting the snap action switch 20 between fixed points as shown in FIG. 15(a), when the temperature goes up the dome of the switch will be expanded so that the snap action switch will finally pop out as shown in FIG. 15(b). Thus, a switch of the type shown in FIG. 15(c) may be used as temperature limit switch. FIG. 15(c) shows a snap action switch which extends between two supports so as to sense pressure or temperature. As shown, the snap action switch may include metal electrode layers 26 between plates 22 and the piezoelectric polymer film 24 or may be of any of the other arrangements described above. The switch of FIG. 15(c) functions as a temperature limit switch when set at the temperature level for the "pop" action and may be adjusted by varying the types of materials used and the shape of the snap action switch 20.

Thus, the present invention may be embodied in other specific forms without departing from the spirit or essential attributes thereof and, accordingly, reference should be made to the appended claims, rather than to the foregoing specification, as indicating the scope of the invention.

I claim:

1. A non-contact piezoelectric switch comprising:
   a first snap action plate with a curved surface;
   a second snap action plate with a curved surface;
   a piezoelectric polymer film having respective surfaces disposed between said curved surfaces of said first and second snap action plates;
   first and second conductors which are respectively electrically connected to said first and second snap action plates; and
   a third conductor intermediate of said first and second conductors,
   whereby said first, second and third conductors are brought into electrical contact with each other upon depression of at least one of said snap action plates and said piezoelectric polymer film is extended or contracted along the surface thereof so as to conduct an electrical signal between said first and second snap action plates.

2. The piezoelectric switch of claim 1, further comprising a load resistance connected between said first and third conductors and a discharge resistance connected between said first and second conductors for preventing charge build-up when said piezoelectric polymer film is in a non-depressed state.

3. The piezoelectric switch of claim 1, further comprising a load resistance connected between said first and third conductors and a discharge diode connected between said first and second conductors for preventing charge build-up when said piezoelectric polymer film is in a non-depressed state.

4. The piezoelectric switch of claim 1, wherein said first, second and third conductors are at least one of metal pins and conductors on a printed circuit board.

5. A non-contact piezoelectric switch comprising:
   a first snap action plate with a curved surface;
   a second snap action plate with a curved surface;
   a piezoelectric polymer film having respective surfaces disposed between said curved surfaces of said first and second snap action plates, whereby upon depression of at least one of said snap action plates said piezoelectric polymer film is extended or contracted along the surface thereof so as to conduct an electrical signal between said first and second snap action plates; and
   a chamber having a fluid normally pressurized to a predetermined level, said first and second snap action plates being disposed across an opening in said chamber so as to be depressed by a change in a pressure differential between the inside and outside of said chamber, whereby conduction of said electrical signal indicates the presence of said change in said pressure differential.

6. The piezoelectric switch of claim 5, wherein said fluid is air.

7. A non-contact piezoelectric switch comprising:
first and second conductors;
a first snap action plate with an upwardly convex surface electrically connected to said first conductor;
a second snap action plate with an upwardly convex surface electrically connected to said second conductor;
a piezoelectric polymer film having respective surfaces disposed between said upwardly convex surfaces of said first and second snap action plates;
first and second electrodes disposed on said respective surfaces of said piezoelectric polymer film; and
a third conductor intermediate of said first and second conductors, whereby upon depression of at least one of said snap action plates said first, second and third conductors are brought into electrical contact with each other and said piezoelectric polymer film is extended or contracted along the surface thereof so as to conduct an electrical signal between said first and second conductors via said first and second electrodes.

8. The piezoelectric switch of claim 7, further comprising a load resistance connected between said first and third conductors and a discharge resistance connected between said first and second conductors for preventing charge build-up when said piezoelectric polymer film is in a non-depressed state.

9. The piezoelectric switch of claim 7, further comprising a load resistance connected between said first and third conductors and a discharge diode connected between said first and second conductors for preventing charge build-up when said piezoelectric polymer film is in a non-depressed state.

10. A non-contact piezoelectric switch comprising:
first and second conductors;
a first snap action plate with an upwardly convex surface electrically connected to said first conductor;
a second snap action plate with an upwardly convex surface electrically connected to said second conductor;
a piezoelectric polymer film having respective surfaces disposed between said upwardly convex surfaces of said first and second snap action plates;
first and second electrodes disposed on said respective surfaces of said piezoelectric polymer film, whereby upon depression of at least one of said snap action plates said piezoelectric polymer film is extended or contracted along the surface thereof so as to conduct an electrical signal between said first and second conductors via said first and second electrodes; and
a chamber having a fluid normally pressurized to a predetermined level, said first and second snap action plates being disposed across an opening in said chamber so as to be depressed by a change in a pressure differential between the inside and outside of said chamber, whereby conduction of said electrical signal indicates the presence of said change in said pressure differential.

11. The piezoelectric switch of claim 10, wherein said fluid is air.

12. A non-contact piezoelectric switch comprising:
a first snap action plate with a curved surface;
a second snap action plate with a curved surface;
a piezoelectric polymer film having respective surfaces disposed between said curved surfaces of said first and second snap action plates, whereby said first and second snap action plates are depressed as a result of thermal expansion thereof when a predetermined temperature is exceeds, thereby extending or contracting said piezoelectric polymer film along the surface thereof so as to conduct an electrical signal between said first and second snap action plates.

13. A non-contact piezoelectric switch comprising:
first and second conductors;
a first snap action plate with an upwardly convex surface electrically connected to said first conductor;
a second snap action plate with an upwardly convex surface electrically connected to said second conductor;
a substantially disc-shaped piezoelectric polymer film having respective surfaces disposed between said upwardly convex surfaces of said first and second snap action plates;
first and second substantially disc-shaped electrodes disposed on said respective surfaces of said piezoelectric polymer film; and
an electrical insulator having a ring-like shape for insulating said first and second electrodes from said first and second snap action plates when neither of said snap action plates is in a depressed state,
whereby upon depression of at least one of said snap action plates said first and second electrodes are brought into electrical contact with said first and second snap action plates and said piezoelectric polymer film is extended or contracted along the surface thereof so as to conduct an electrical signal between said first and second conductors via said first and second electrodes.

14. A non-contact piezoelectric switch comprising:
first and second conductors;
a first snap action plate with an upwardly convex surface electrically connected to said first conductor;
a second snap action plate with an upwardly convex surface electrically connected to said second conductor;
a piezoelectric polymer film having respective surfaces disposed between said upwardly convex surfaces of said first and second snap action plates; and
first and second electrodes disposed on said respective surfaces of said piezoelectric polymer film, whereby said first and second snap action plates are depressed as a result of thermal expansion thereof when a predetermined temperature is exceeded, thereby extending or contracting said piezoelectric polymer film along the surface thereof so as to conduct an electrical signal between said first and second conductors via said first and second electrodes.

15. A non-contact piezoelectric switch comprising:
a first disc-shaped snap action plate with a curved surface;
a second disc-shaped snap action plate with a curved surface;
a piezoelectric polymer film having respective surfaces disposed between said curved surfaces of said first and second snap action plates so as to electrically insulate said first and second snap action plates;

first and second electrodes disposed on said respective surfaces of said piezoelectric polymer film so as to be respectively electrically coupled to said first and second snap action plates upon depression thereof, whereby upon such depression at least one of said snap action plates said piezoelectric polymer film is extended or contracted along the surface thereof so as to begin to conduct an electrical signal between said first and second snap action plates via said first and second electrodes; and a chamber having a fluid normally pressurized to a predetermined level, said first and second snap action plates being disposed across an opening in said chamber so as to be depressed by a change in a pressure differential between the inside and outside of said chamber, whereby conduction of said electrical signal indicates the presence of said change in said pressure differential.

16. A non-contact piezoelectric switch comprising:

a first disc-shaped snap action plate with a curved surface;

a second disc-shaped snap action plate with a curved surface;

a piezoelectric polymer film having respective surfaces disposed between said curved surfaces of said first and second snap action plates so as to electrically insulate said first and second snap action plates; and first and second electrodes disposed on said respective surfaces of said piezoelectric polymer film so as to be respectively electrically coupled to said first and second snap action plates upon depression thereof, whereby said first and second snap action plates are depressed as a result of thermal expansion thereof when a predetermined temperature is exceeded, thereby extending or contracting said piezoelectric polymer film along the surface thereof so as to begin to conduct an electrical signal between said first and second snap action plates via said first and second electrodes.

17. The piezoelectric switch of claim 15, wherein said fluid is air.

18. A non-contact piezoelectric switch comprising:

a first snap action plate with a curved surface;

a second snap action plate with a curved surface;

a substantially disc-shaped piezoelectric polymer film having respective surfaces disposed between said curved surfaces of said first and second snap action plates;

first and second substantially disc-shaped electrodes disposed on said respective surfaces of said piezoelectric polymer film so as to conduct an electrical signal between said first and second snap action plates; and an insulator having a ring-like shape for electrically insulating said first and second electrodes from said first and second snap action plates when neither of said snap action plates is in a depressed state, whereby upon depression of at least one of said snap action plates said first and second electrodes are brought into electrical contact with said first and second snap action plates and said piezoelectric polymer film is extended or contracted along the surface thereof so as to conduct said electrical signal between said first and second snap action plates.

* * * * *

UNITED STATES PATENT AND TRADEMARK OFFICE
CERTIFICATE OF CORRECTION

PATENT NO. : 5,315,204

DATED : May 24, 1994

INVENTOR(S) : PARK

It is certified that error appears in the above-identified patent and that said Letters Patent is hereby corrected as shown below:

Claim 12, Column 12, Line 6 "exceeds" should be --exceeded--

Signed and Sealed this

Second Day of January, 1996

BRUCE LEHMAN

*Attest:*

*Attesting Officer*                *Commissioner of Patents and Trademarks*